(12) United States Patent
Lee et al.

(10) Patent No.: US 6,887,772 B2
(45) Date of Patent: May 3, 2005

(54) STRUCTURES OF HIGH VOLTAGE DEVICE AND LOW VOLTAGE DEVICE, AND METHOD OF MANUFACTURING THE SAME

(75) Inventors: Dae Woo Lee, Daejon-Shi (KR); Tae Moon Roh, Daejon-Shi (KR); Yil Suk Yang, Daejon-Shi (KR); Il Yong Park, Pyeongtaek-Shi (KR); Byoung Gon Yu, Daejon-Shi (KR); Jong Dae Kim, Daejon-Shi (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/721,970

(22) Filed: Nov. 24, 2003

(65) Prior Publication Data

US 2004/0121547 A1 Jun. 24, 2004

(30) Foreign Application Priority Data

Dec. 18, 2002 (KR) .............................. 10-2002-0081474

(51) Int. Cl.[7] .................... H01L 21/20; H01L 21/8238; H01L 21/76
(52) U.S. Cl. ........................ 438/479; 438/219; 438/404
(58) Field of Search ................................ 438/479, 295, 438/219, 224, 404, 412; 257/500

(56) References Cited

U.S. PATENT DOCUMENTS

| | | | | |
|---|---|---|---|---|
| 5,097,314 A | * | 3/1992 | Nakagawa et al. | 257/500 |
| 5,302,966 A | | 4/1994 | Stewart | |
| 5,378,912 A | * | 1/1995 | Pein | 257/335 |
| 5,463,238 A | * | 10/1995 | Takahashi et al. | 257/351 |
| 5,587,329 A | | 12/1996 | Hseuh et al. | |
| 5,773,326 A | * | 6/1998 | Gilbert et al. | 438/154 |
| 5,780,900 A | * | 7/1998 | Suzuki et al. | 257/335 |
| 5,792,678 A | * | 8/1998 | Foerstner et al. | 438/155 |
| 5,904,535 A | * | 5/1999 | Lee | 438/341 |
| 5,973,358 A | * | 10/1999 | Kishi | 257/324 |
| 6,087,232 A | * | 7/2000 | Kim et al. | 438/289 |
| 6,100,565 A | * | 8/2000 | Ueda | 257/348 |
| 6,222,234 B1 | * | 4/2001 | Imai | 257/347 |
| 6,314,021 B1 | * | 11/2001 | Maeda et al. | 365/185.01 |
| 6,387,741 B1 | * | 5/2002 | Kawano | 438/165 |
| 6,424,016 B1 | * | 7/2002 | Houston | 257/407 |
| 6,465,324 B2 | * | 10/2002 | Vogt et al. | 438/425 |
| 6,657,257 B2 | * | 12/2003 | Ohyanagi et al. | 257/347 |
| 6,703,673 B2 | * | 3/2004 | Houston | 257/407 |
| 6,724,045 B1 | * | 4/2004 | Ushiku | 257/347 |
| 6,764,917 B1 | * | 7/2004 | Chan et al. | 438/406 |
| 2002/0038898 A1 | * | 4/2002 | Sugiyama et al. | 257/378 |
| 2003/0071308 A1 | * | 4/2003 | Yoshida | 257/348 |
| 2003/0219949 A1 | * | 11/2003 | Pendharkar | 438/299 |

OTHER PUBLICATIONS

G. Dolny et al., *High Density Active Matrix Electroluminescent Display using Single–Crystal Silicon–on–Insulator High–Voltage IC Technology*, IEDM, 1993, pp. 930–932.

* cited by examiner

*Primary Examiner*—C. Everhart
*Assistant Examiner*—Lex H. Malsawma
(74) *Attorney, Agent, or Firm*—Blakely Sokoloff Taylor & Zafman

(57) ABSTRACT

The present invention relates to structures of a high voltage device and a low voltage device formed on a SOI substrate and a method for manufacturing the same, and it is characterized in which the low voltage device region of silicon device regions in a SOI substrate is higher than the high voltage device region by steps, and a thickness of the silicon device region, where the high voltage device is formed, is equal to a junction depth of impurities of a source and drain in the low voltage device. Accordingly, silicon device regions in the SOI substrate are divided into the high voltage region and the low voltage region and steps are formed there between by oxidation growth method, so that the high voltage device having low junction capacitance can be made, and the low voltage device compatible with the conventional CMOS process and device characteristics can also be made at the same time.

5 Claims, 5 Drawing Sheets

STRUCTURES OF HIGH VOLTAGE DEVICE AND LOW VOLTAGE DEVICE, AND METHOD OF MANUFACTURING THE SAME

BACKGROUND OF THE INVENTION

1. Field of the Invention

The present invention relates to a pixel of an organic electroluminescent display (ELD), in particular to structures of a high voltage device and a low voltage device using steps of silicon element regions in a silicon-on-insulator (SOI) and a method for manufacturing the same.

2. Description of the Prior Art

FIG. 1 is a cross sectional view for explaining structures of a high voltage device and a low voltage device in accordance with the prior art. The high voltage device used for pixels of an inorganic ELD has been manufactured by using the SOI substrate having a silicon element region with relatively thin thickness in order to obtain low junction capacitance. Referring to FIG. 1, the structure of the high voltage device and the low voltage device used for pixels of the inorganic ELD in accordance with the prior art consists of p-wells 114 and 118, a drift region 116, gate oxidation films 126 and 128, gate electrodes 130a and 130b, source/drain regions 136a, 136b, 136c, and 136d, and source/drain electrodes 140a, 140b, 142a, and 142b on a lower substrate 100 and a buried oxidation film 102 of the SOI substrate.

In the high voltage device and the low voltage device in accordance with the prior art as shown in FIG. 1, the junction depth of source regions 136a and 136c and drain regions 136b and 136d is equal to a thickness of an upper silicon layer, which is an active layer of the SOI substrate. In particular, when the SOI substrate having thin silicon element region of 1 $\mu$m class (hereinafter, thin SOI substrate) is used, a LDMOS (lateral double diffused MOS) device with low junction capacitance can be manufactured. However, when the thin SOI substrate is used, it has been difficult to control electrical characteristics of the low voltage device by a kink effect, which means a drain current increases drastically as a gate voltage increases in the case of the partially depleted low voltage device applied to logic drive circuits owing to the thin silicon element region. In addition, in terms of the process, it is difficult to manufacture both the low voltage device and the high voltage device compatible with the conventional process of submicron CMOS device at the same time, while adjusting the junction depth between the source and the drain.

SUMMARY OF THE INVENTION

Therefore, the object of the present invention is to provide structures of a stable low voltage device and a high voltage device with low junction capacitance by using steps of silicon element regions.

The other object of the present invention is to provide a method for manufacturing a high voltage and a low voltage device compatible with a submicron CMOS process on a SOI substrate.

To achieve the object, in structures of the high voltage and low voltage devices formed on the SOI substrate in accordance with the present invention, it is preferable that the height of the low voltage device region of silicon element regions in the SOI substrate is higher than that of the high voltage device region by steps, and a height of a lower end of a source region and a drain region in the low voltage device region is equal to that of a upper end of the silicon element regions in the high voltage device region.

To achieve the other object, the method for manufacturing the high and the low voltage devices in accordance with the present invention comprises steps of; depositing a first oxidation film and a nitride film sequentially on a SOI substrate where a lower substrate, a buried oxidation film and upper silicon layer are sequentially stacked; removing the nitride film and the first oxidation film of a high voltage device region by etching, after defining the high voltage device region on a total structure; forming the upper silicon layer of the high voltage device region thinner than the upper silicon layer of the low voltage device region by growing a second oxidation film in the high voltage device region; removing the second oxidation film and the remaining portions of the nitride film and the first oxidation film; forming the high voltage device region and low voltage device region by etching the upper silicon layer, after defining an device isolation region; forming a p-well in the low voltage device region, and a p-well and a drift region in the high voltage device region; forming a thin gate insulation film in the low voltage device region, and a thick gate insulation film in the high voltage device region; forming a gate electrode, a LDD(lightly doped drain) region, a sidewall oxidation film, a source region and a drain region in the low voltage device region and the high voltage device region, respectively; and forming a source electrode and a drain electrode, after depositing an interlayer insulation film on an upper surface of a total structure.

The high voltage device in accordance with the present invention is a LDMOS device having low junction capacitance, and the low voltage device is a MOS device and is compatible with electrical variables and conventional CMOS device process. The high voltage device having low junction capacitance by using steps of silicon element regions in the SOI substrate, and the low voltage device compatible with the conventional CMOS device process can be readily manufactured at the same time.

In the case of the high voltage device, it is very important to adjust the thickness of the silicon element region in the SOI substrate by using a thermal oxidation method. In particular, the thickness of the silicon element region, where the high voltage device is formed, should be adjusted to be equal to a junction depth of impurities of the source and drain in the submicron class—low voltage device. And after forming the n-drift region, it is important to optimize device structures, distribution of p-well impurity concentration, n-drift region, and gate electrode length of a polycrystalline silicon film, etc, while adjusting channel length by laterally extending the p-well for forming a channel.

In addition, in the case of the low voltage device of submicron class, ion implantation conditions and the thermal treatment temperature, etc are significant variables for optimizing the concentration of p-well impurity.

DESCRIPTION OF THE PREFERRED EMBODIMENTS

Now the preferred embodiments according to the present invention will be described with reference to the accompanying drawings. Since the preferred embodiments are provided for the purpose that the ordinary skilled in the art are able to understand the present invention, they may be modified in various manners and the scope of the present invention is not limited by the preferred embodiment described later.

FIGS. 2A to 2H are cross sectional views for explaining a method for manufacturing a high voltage device and a low voltage device in accordance with the preferred embodiment of the present invention.

Figure 2A:
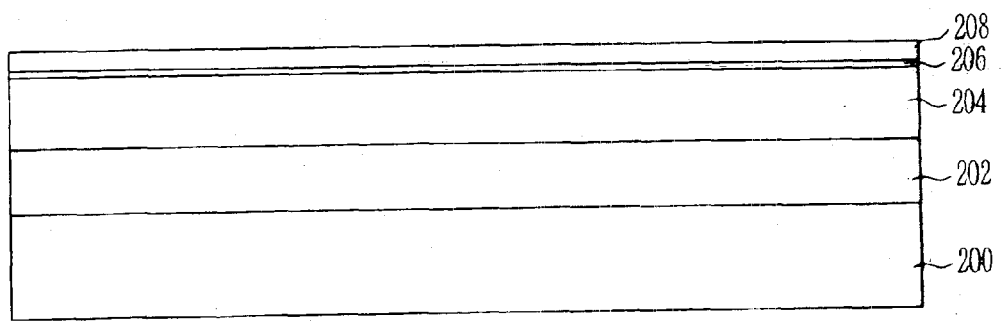
FIGS. 2A to 2H are cross sectional views for explaining a method for manufacturing the high voltage device and the low voltage device in accordance with the preferred embodiment of the present invention.
Figure 2B:
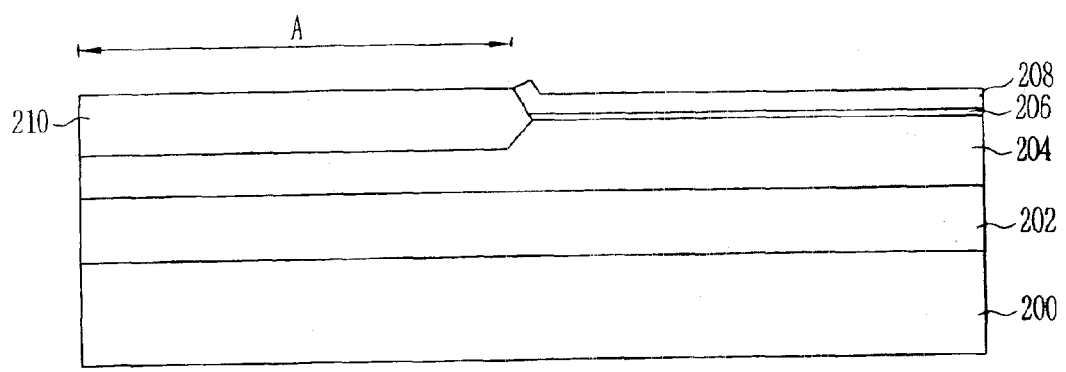

Referring to FIG. 2A, a first oxidation film 206 is formed on a SOI substrate. The SOI substrate consists of a p-type lower silicon layer 200, a buried oxidation film 202, and a p-type upper silicon layer 204. The upper silicon layer 204 becomes a silicon device region. The buried oxidation film 202 is in a range of approximately 1~3 $\mu$m in thickness, the silicon device region 204 is in a range of approximately 1~2 $\mu$m in thickness, and the first oxidation film 206 is about 300~400 Å in thickness. Subsequently, a first nitride film 208 is then formed on the first oxidation film 206. The first nitride film 208 is in a range of 3000~5000 Å in thickness, and is preferably deposited by LPCVD method.

Referring to FIG. 2A, after depositing a photoresist (not shown) and defining a high voltage device region A by a photolithography process, the first nitride film 208 and the first oxidation film 206 in the high voltage device region are dry etched. And then a second oxidation film 210 is formed on the high voltage device region A. The second oxidation film 210 is in a range of 6000~8000 Å in thickness preferably. At this time, it is preferable to adjust the thickness of the upper silicon layer 204 of the SOI substrate corresponding to the high voltage device region A to be in a range of approximately 0.2~0.5 $\mu$m by etching, for the purpose of achieving them, the growth and etching processes for the second oxidation film can be performed repeatedly. The general electric furnace can be used for the oxidation growth; however, the thickness of the upper silicon layer 204 can be readily controlled by using high-pressure oxidation growth process, which is used for fast oxidation film growth.

Figure 2C:
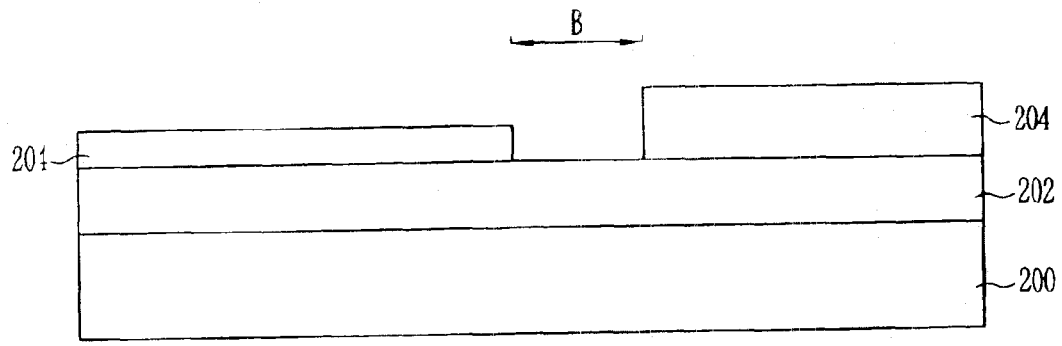

In the following, referring to FIG. 2C, the first nitride film 208 and the second oxidation film 210 are removed by wet etching, whereby a device isolation region B is formed.

When the first nitride film 208 and the second oxidation film 210 are removed by wet etching, to prevent surfaces of silicon layers of high and low voltage device regions from being damaged, the second oxidation film 210 is wet etched while leaving some of the second oxidation film 210 on the high voltage device region to an extent of predetermined thickness, and then the first nitride film 208 is wet etched followed by the remaining oxidation films 206 and 210 can be wet etched. The device isolation region B is defined by the photolithography process, after the low temperature oxidation film (not shown) having approximately 4000 Å in thickness is deposited and a photoresist film is coated thereon. And after the low temperature oxidation film is dry etched, the upper silicon layer 204 of the device isolation region is etched. Sequentially the photoresist film is removed, and then the low temperature oxidation film (not shown) having approximately 4000 Å in thickness is removed by etching.

Figure 2D:
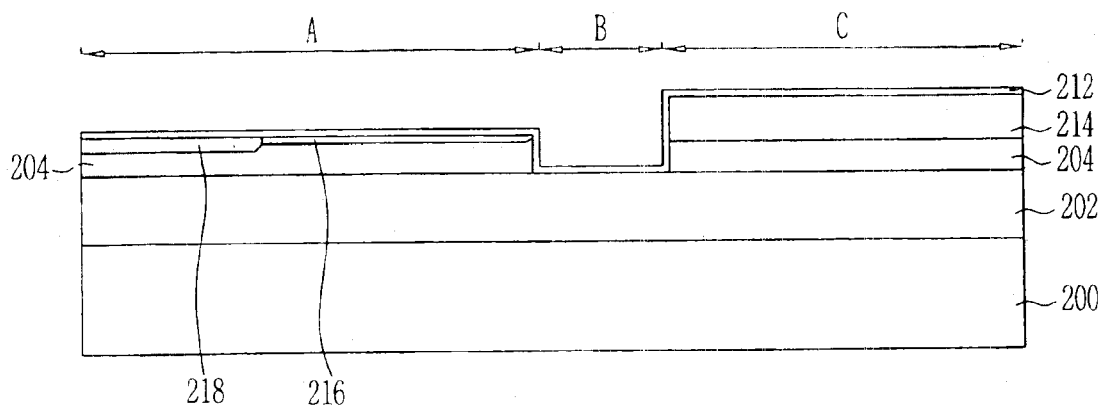

Referring to FIG. 2D, the third oxidation film 212 is formed in a range of 300~400 Å in thickness on the surface of the total structure. Then a p-well 214 is formed in the low voltage device region C, and a drift region 216 and a p-well 218 are formed in the high voltage device region A. The p-well 214 in the low voltage device region C is formed by coating a photoresist film thereon, and defining the p-well 214 region by photolithography process and then implanting boron ions.

After the photoresist film is removed, a first thermal treatment is performed in an atmosphere of $N_2$ and at a temperature of 1150° C. The drift region 216 in the high voltage device region A is formed by coating a photoresist film, defining the drift region 216 by photolithography process and then implanting phosphorous ions. The p-well 218 in the high voltage device region A is formed by coating a photoresist film, defining the p-well region 218 of the high voltage device by photolithography process, implanting boron ions, and then removing the photoresist film.

Figure 2E:
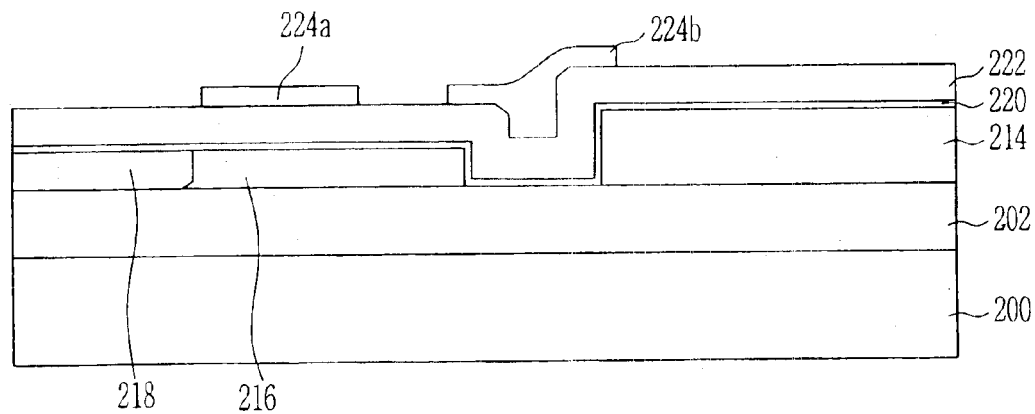

Referring to FIG. 2E, a second thermal treatment is performed in an atmosphere of $N_2$ and at a temperature of 1150° C., and the remaining third oxidation film 212 is removed. A fourth oxidation film 220 and an insulation film 222 are deposited on the surface of the total structure, and the second nitride film is deposited on field region of the high voltage device and the device isolation region. At this time, it is preferable that the fourth oxidation film 220 is formed with a thickness in a range of 300~400 Å, the insulation film 222 is formed by depositing low temperature oxidation film with a thickness in a range of 5000~7000 Å, and the second nitride film is formed with a thickness in a range of 2000~3000 Å. If photoresist film coating, photolithography, and nitride film etching processes are successively performed, the resulting second nitride film patterns 224a and 224b are formed on the field region of the high voltage device and the device isolation region, respectively. Alternatively, photoresist film patterns may be selected on the field region of the high voltage device and the device isolation region without the second nitride film depositing process.

Figure 2F:
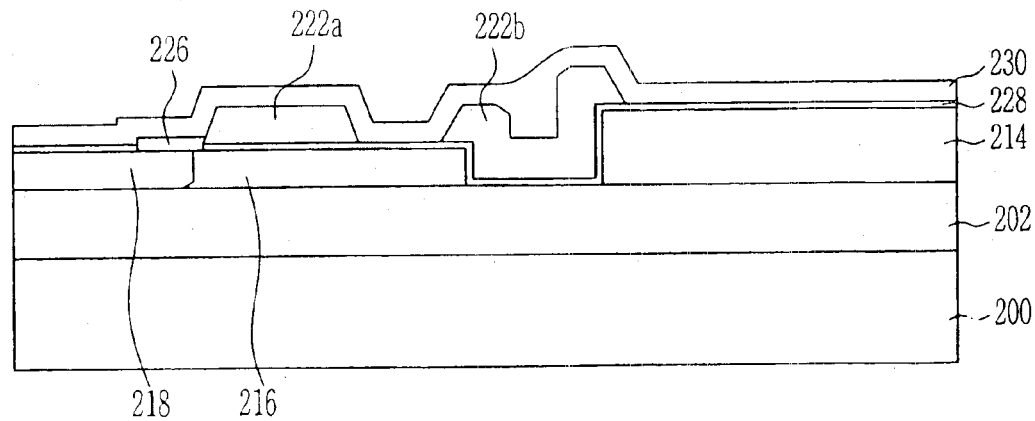

Next, referring to FIG. 2F, the insulation film 222 is etched to be removed by using the second nitride film patterns 224a and 224b as masks. After the above second nitride film patterns 224a and 224b are removed, un-etched parts 222a and 222b of the insulation film 222 that have not been etched are remained.

Subsequently, a thick gate oxidation film 226 is formed in the high voltage device region, and a thin gate oxidation film 228 in the low voltage device region. And polycrystalline silicon film 230 is deposited on the surface of the total structure in order to form a gate electrode. Gate oxidation films in the high voltage and the low voltage regions can be made as follows. After an oxidation film with a thickness in a range of 200~300 Å is grown on the surface of the total structure, $BF_2$ ions are implanted in a $1\sim2\times10^{13}$ cm$^{-2}$ doses to adjust threshold voltages of devices. And photoresist film is coated thereon and oxidation film of a gate region of the low voltage device is wet etched through photolithography process, then the photoresist film is removed. Next, the gate oxidation film having a thickness of approximately 170 Å is grown, and the resulting thick oxidation film 226 is formed in the high voltage device region, and a thin gate oxidation film 228 in the low voltage device region. It is preferable that the polycrystalline silicon film 230 is deposited to a thickness in a range of 3000~4000 Å for forming gate electrodes and $POCl_3$ doping is performed.

Figure 2G:
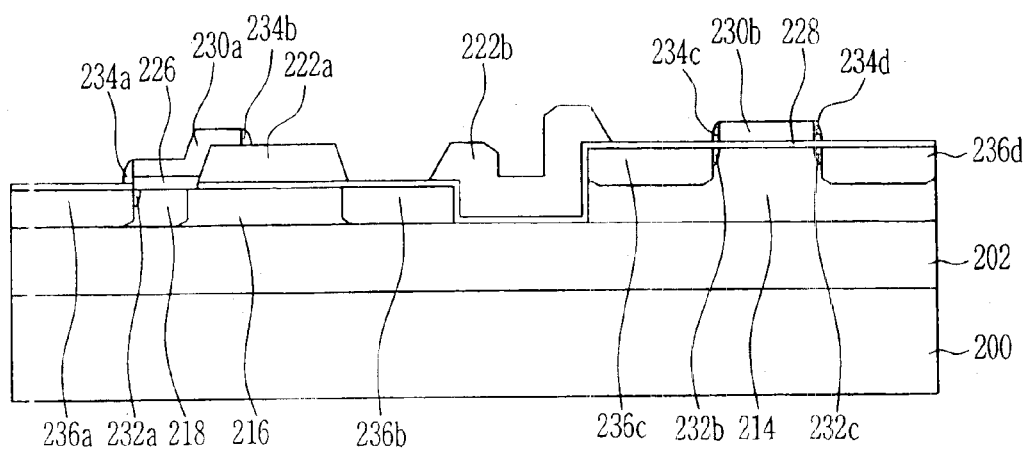

Referring to FIG. 2G, gate electrodes 230a, 230b, and LDD regions 232a, 232b, and 232c are formed in the high voltage device and the low voltage device regions. Side wall oxidation films 234a, 234b, 234c, and 234d are formed at edges of gate electrodes in the high voltage device and the low voltage device regions, and source and drain regions 236a, 236b, 236c, and 236d are also formed at those edges.

Gate electrodes 230a and 230b for the high voltage device and the low voltage device regions can be formed by coating a photoresist film, and performing photolithography and etching process for polycrystalline silicon film 230. In order to form LDD regions 232a, 232b, and 232c for the high voltage device and the low voltage device regions, after coating a photoresist film and defining the LDD regions by photolithography, a dose of approximately $2\times10^{13}$ cm$^{-2}$ phosphorus ions can be implanted. Next, the photoresist film is removed, a low temperature oxidation film with a range of 4000 Å in thickness is deposited, and a reactive ion etching is performed, whereby side wall oxidation films 234a, 234b, 234c, and 234d are formed at edges of the gate electrodes of devices. And the oxidation film with a thickness in a range of 100~200 Å is grown in the source and drain regions 236a, 236b, 236c, and 236d, then a photoresist film is coated, n+ source and drain regions are defined by photolithography, and arsenic ions are implanted. Subsequently, the photoresist film is removed, and then a thermal treatment is performed at 900° C.

Figure 2H:
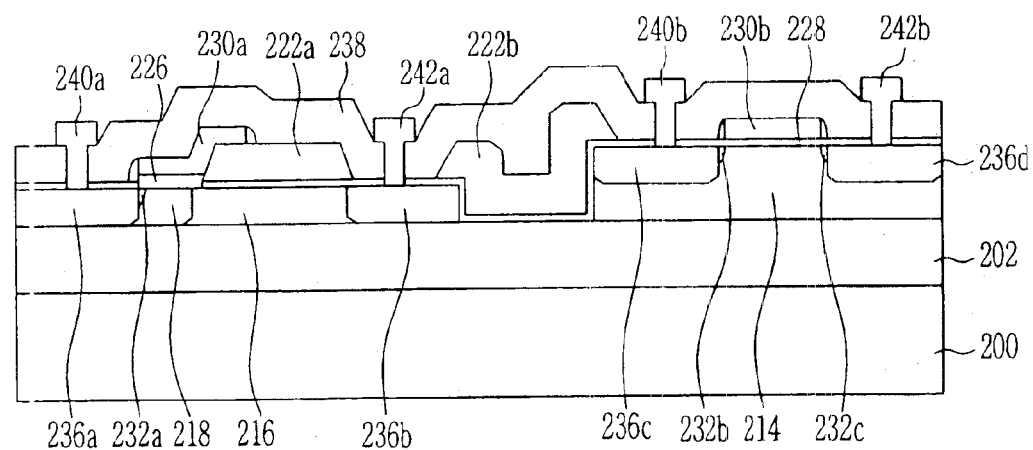

Referring to FIG. 2H, an interlayer insulation film 238 is deposited on the surface of the total structure. The interlayer insulation film 238 can be deposited to have a thickness of 6000 Å at low temperature. At this time, TEOS (Tetra Ethyl Ortho Silicate) with a thickness of 1500 Å and BPSG(Boro Phosphor Silicate Glass) with a thickness of 4500 Å can be used as the interlayer insulation film 238.

Source electrodes 240a and 240b and drain electrodes 242a and 242b of each device are formed in the high voltage device region and the low voltage device region, respectively.

In other words, after coating a photoresist film, contact holes of n$^+$ source/drain regions are formed in the high voltage device region and the low voltage device region through photolithography and dry etching, and then a metal layer is formed on the front surface of the substrate and patterned by photolithography and metal etching process, whereby the source electrode 240a and the drain electrode 242a of the high voltage device and the source electrode 240b and the drain electrode 242b of the low voltage device are formed. At the same time, metal gate electrodes (not shown) of each device are formed and metal thermal treatment process is performed at last, the resulting high voltage nLDMOS device and the low voltage nMOS device for power drive IC and pixels of an inorganic ELD are manufactured.

Hereinafter, structures of the high voltage device and the low voltage device in accordance with the other embodiment of the present invention will be explained.

Figure 1:
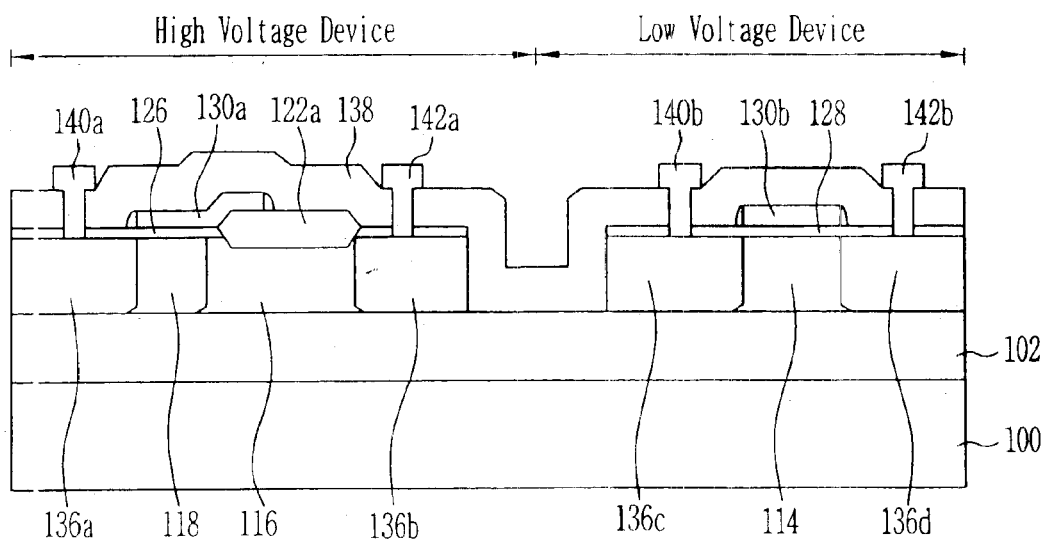
FIG. 1 is a cross sectional view for explaining structures of the high voltage device and the low voltage device in accordance with the prior art.
Figure 3:
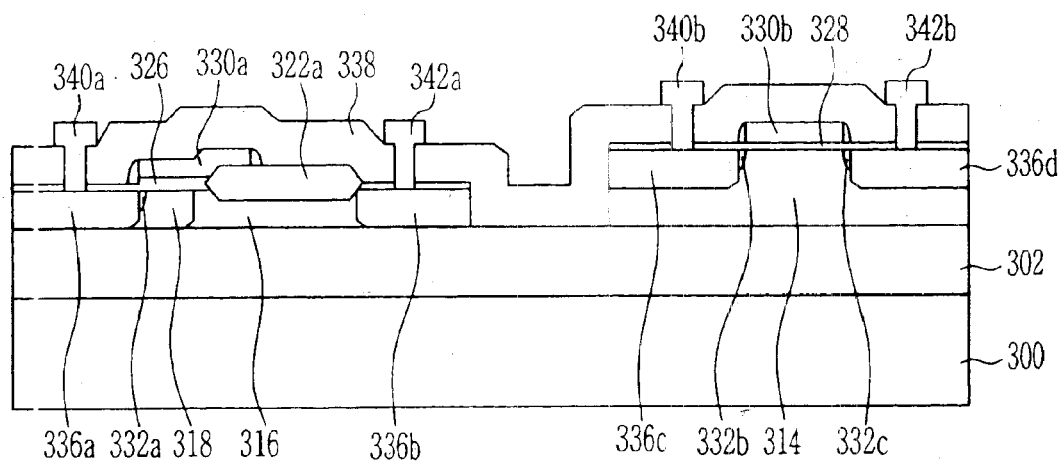
FIG. 3 is a cross sectional view for explaining structures of the high voltage device and the low voltage device in accordance with the other embodiment of the present invention.

FIG. 3 is a cross sectional view for explaining the structures of the high voltage and the low voltage devices in accordance with other embodiment of the present invention. Components shown in FIG. 3 are the same as those shown in FIG. 2H, the components are only things that have the same most left digit of the reference symbols in FIG. 3, as those in FIG. 2H Referring to FIG. 3, this corresponds to the case that a field insulation film 322a of the high voltage device is grown to be the thermal oxidation film, and this helps to explain a method having compatibility with conventional device characteristics and submicron CMOS process, compared to FIG. 2H.

In the embodiment shown in FIG. 3, the thickness of silicon device regions where the high voltage device are formed on a SOI substrate should be adjusted to be equal to a junction depth of impurities of the source and drain in the low voltage device, in the same manner as FIG. 2H.

Figure 4:
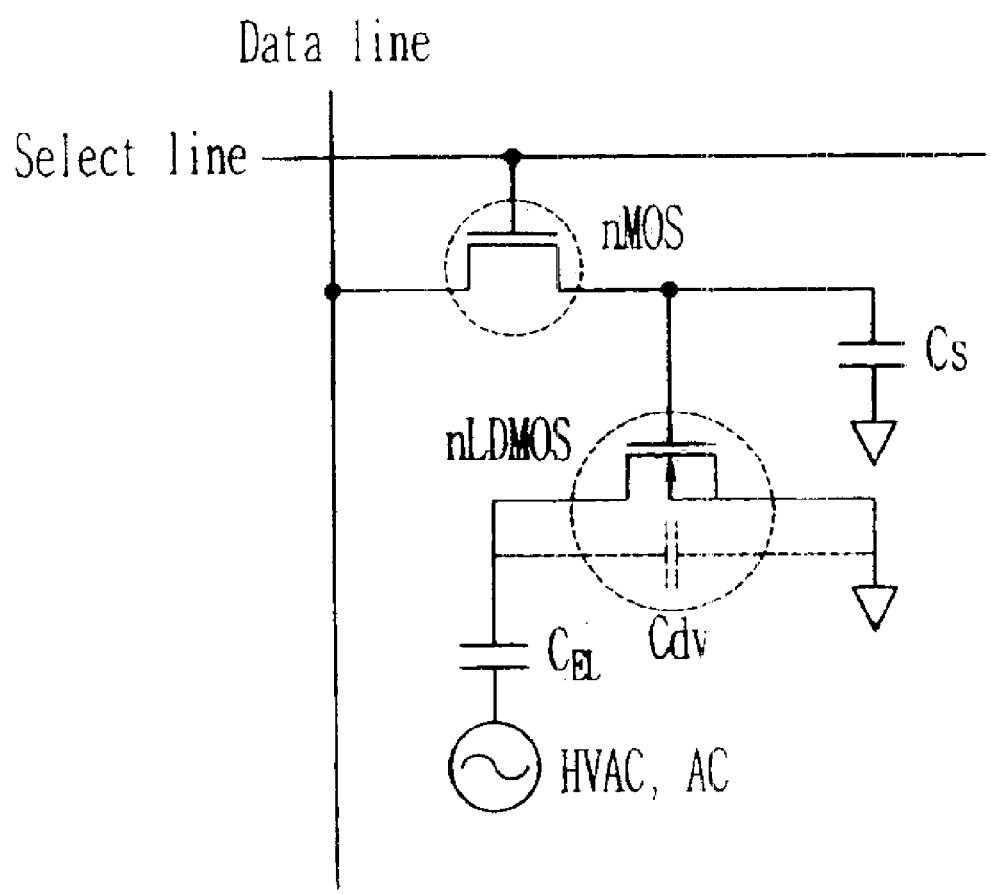
FIG. 4 is a circuit view for explaining a case that the high voltage device and the low voltage device in accordance with the present invention are applied to pixels of an inorganic ELD.

FIG. 4 is a circuit view for explaining an example that the high voltage device and the low voltage device in accordance with the present invention are applied to pixels of an inorganic ELD.

Referring to FIG. 4, a horizontal line indicates a Select line, and a vertical line indicates a Data line.

nMOS is the low voltage device in accordance with the present invention, and nLDMOS is the high voltage device in accordance with the present invention.

Cs, Cdv, and $C_{EL}$ are a storage capacitance, a junction capacitance of the high voltage device, and a capacitance of EL(electroluminescence) device, respectively, and HVAC is an alternating power voltage applied to pixels.

According to the method for manufacturing the high and low voltage devices of the present invention, the high voltage device having low junction capacitance and the low voltage device compatible with the conventional CMOS process can be manufactured at the same time Although the present invention has been described in conjunction with the preferred embodiment, the present invention is not limited to the embodiments, and it will be apparent to those skilled in the art that the present invention can be modified in variation within the scope of the invention.

As described above, in accordance with structures of the high voltage device and the low voltage device and a method for manufacturing the same of the present invention, silicon device regions in the SOI substrate are divided into the high voltage region and the low voltage region and steps are formed there between by the oxidation growth method, whereby the high voltage device having low junction capacitance can be made, and the low voltage device compatible with the conventional CMOS process and device characteristics can also be made at the same time. In addition, integration and resolution of display pixels can be improved through the fine patterning and process optimization. Furthermore, the structures of the high and the low voltage devices and the method for manufacturing the same of the present invention can be applied for various power drive ICs requiring high voltage, high speed and high performance, as well as display pixels.

What is claimed is:

1. A method for manufacturing a high voltage device and a low voltage device comprising steps of:

(a) depositing a first oxidation film and a nitride film sequentially on a SOI substrate where a lower substrate, a buried oxidation film and an upper silicon layer are sequentially stacked;

(b) removing the nitride film and the first oxidation film of the high voltage device region by etching, after defining the high voltage device region on a total structure;

(c) forming the upper silicon layer of the high voltage device region thinner than the upper silicon layer of the low voltage device region by growing a second oxidation film in the high voltage device region;

(d) removing the second oxidation film and the remaining portions of the nitride film and the first oxidation film;

(e) forming the high voltage device region and the low voltage device region by etching the upper silicon layer, after defining a device isolation region;

(f) forming a p-well in the low voltage device region, and a p-well and a drift region in the high voltage device region;

(g) forming a thin gate insulation film in the low voltage device region, and a thick gate insulation film in the high voltage device region;

(h) forming a gate electrode, a LDD region, a sidewall oxidation film, a source region and a drain region in the low voltage device region and the high voltage device region, respectively; and (i) forming a source electrode and a drain electrode, after depositing an interlayer insulation film on an upper surface of a total structure.

2. The method as claimed in claim 1, wherein in the (c) step, the second oxidation film is grown to have 6000~8000 Å in thickness, and the upper silicon layer of the high voltage device region is in a range of 0.2~0.5 $\mu$m in thickness.

3. The method as claimed in claim 1, wherein in the (c) step, the second oxidation film is grown by using a high-pressure oxidation growth process.

4. The method as claimed in claim 1, wherein the (g) step comprises steps of;

forming a third oxidation film in the high voltage device region and the low voltage device region;

performing ion implantation in the low voltage device region, thereby a threshold voltage being adjustable;

removing the third oxidation film formed in the low voltage device region; and forming a fourth oxidation film on the high voltage device region and the low voltage device region.

5. The method as claimed in claim 1, wherein in the (h) step, a thickness of the silicon device region, where the high voltage device is formed, is equal to a junction depth of impurities of the source and drain in the low voltage device.

* * * * *